United States Patent [19]

Ringland

[11] 4,028,629
[45] June 7, 1977

[54] BAND PASS AMPLIFIER

[75] Inventor: Robert S. Ringland, Burlington, Iowa

[73] Assignee: Tandy Corporation, Fort Worth, Tex.

[22] Filed: Apr. 26, 1976

[21] Appl. No.: 679,882

[52] U.S. Cl. .................................. 330/2; 330/31; 330/40
[51] Int. Cl.² ..................................... H03F 3/04
[58] Field of Search ............. 330/21, 31, 2, 22, 40, 330/29; 325/373, 374, 375, 380, 387, 395, 398, 397, 492, 489

[56] References Cited

UNITED STATES PATENTS

| 2,763,832 | 9/1956 | Shockley | 330/40 X |
| 3,328,714 | 6/1967 | Hugenholtz | 330/29 |
| 3,519,765 | 7/1970 | Huber | 330/40 X |
| 3,953,806 | 4/1976 | Veranth | 330/2 |

Primary Examiner—James B. Mullins
Attorney, Agent, or Firm—Gust, Irish, Jeffers & Rickert

[57] ABSTRACT

A frequency band pass circuit having an amplifier that has an amplifying state and may be selectively deenergized to a non-amplifying state. A reverse bias is placed on the amplifier when in the deenergized state to provide substantially the same band pass characteristics of the circuit in the non-amplifying state as in the amplifying state and to reduce the insertion loss impedance through the amplifier in the non-amplifying state.

10 Claims, 5 Drawing Figures

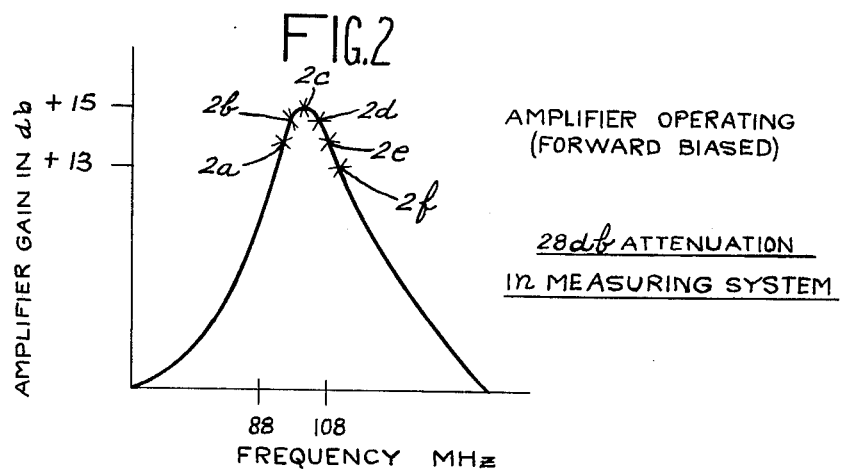
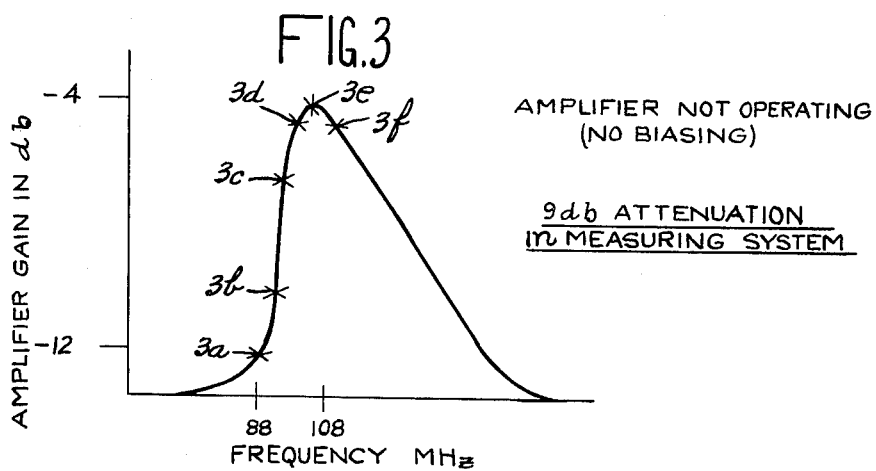
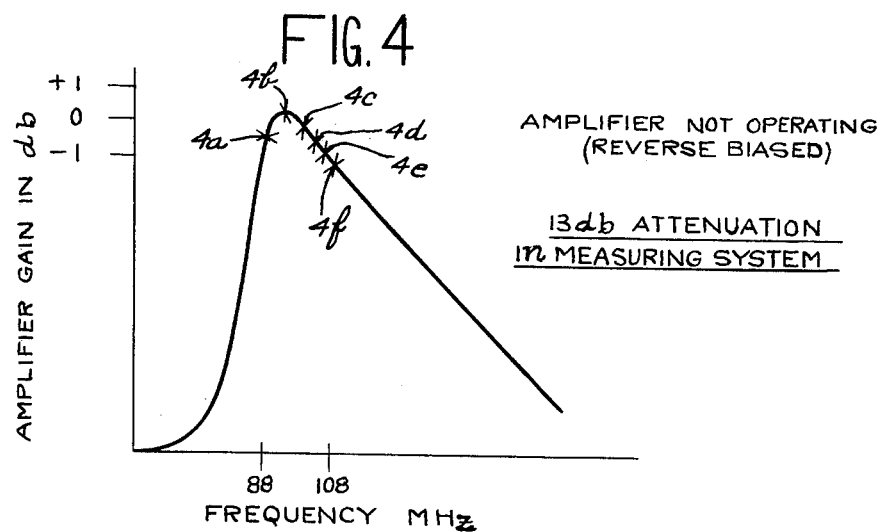

BAND PASS AMPLIFIER

BACKGROUND OF THE INVENTION

1. Field of the Invention

This invention pertains to band pass amplifier circuits and more particularly to circuits wherein the circuit is operated in both amplifying and non-amplifying states.

2. Description of the Prior Art

Band pass circuits having amplifiers are well known. Such circuits usually comprise an impedance having an L/C ratio designed to pass a predetermined band of signal frequencies when the amplifier is in the amplifying state. However, when the amplifier is in the non-amplifying state, i.e., de-energized, the L/C ratio is changed and the band pass characteristics are correspondingly changed, due to changes in the junction capacitances of the active device, which results in detuning or shifting the pass band. This increases the circuit series impedance across the desired pass band causing significant undesirable attenuation.

SUMMARY OF THE INVENTION

A band pass circuit and amplifier have a given L/C ratio in the amplifying state of the circuit. An inductor and capacitor, together with the base-collector capacitance of an amplifying transistor, form a tuned circuit for passing a frequency band, such as an FM frequency band of 88–108 MHz. When it is desired to switch to a non-amplifying state, opposite biases are placed across the base-collector and base-emitter junctions, causing the capacitance across the base-collector junction to increase and its impedance to decrease. The capacitance across the base-emitter junction is decreased and its impedance increased. The primary current path is across the base-collector junction in the non-amplifying state and across the collector-base-emitter junctions in the amplifying state.

This invention has application to AM-FM automobile radios where it is required to amplify the FM signal in an FM band pass circuit in outlying or weak FM signal areas but in strong FM signal areas, it is desirable to deenergize the amplifier to prevent high signal or overload distortion. However, when the amplifier transistor is deenergized, it has been found that the impedance across an inactive transistor amplifier exceeded that tolerable for acceptable signal reception. Further, when the amplifier transistor was deenergized the frequency-gain pass band curve shifted along the frequency coordinate so that the pass band was no longer centered on the band of received signals, resulting in severe additional attenuation of signals at one end of the pass band. This was due to the internal capacitance change of the amplifier transistor when the amplifier transistor went from an energized state to a deenergized state. By placing a reverse bias on the transistor in the non-amplifying or "inactive" state, not only is the impedance across the amplifier transistor lowered, but the internal transistor capacitance remains approximately constant to maintain the frequency-gain pass band substantially centered on the band of received signals. Thus, this invention provides an acceptable solution to the problems without bypassing the transistor.

It is an object of this invention to provide a band pass amplifier wherein signal transmission in the active and inactive amplifier states is at acceptable and preferred levels.

Another object is to provide a device of the foregoing object having comparable band pass characteristics in both the active and inactive amplifying states, and thereby to lower insertion loss in the inactive state across said pass band.

A further object is to provide a reverse bias to the amplifier of the device of the foregoing objects during the inactive amplifier state.

The above-mentioned and other features and objects of this invention and the manner of attaining them will become more apparent and the invention itself will be best understood by reference to the following description of an embodiment of the invention taken in conjunction with the accompanying drawings.

BRIEF DESCRIPTION OF THE DRAWINGS

FIG. 2 is a graph with gain plotted along the ordinate and frequency along the absissca when the amplifier is forward biased;

FIG. 3 is a graph with gain plotted along the ordinate and frequency along the absissca when the amplifier is in a non-amplifying unenergized state;

FIG. 4 is a graph with gain plotted along the ordinate and frequency along the absissca when the amplifier is reverse-biased.

DESCRIPTION OF THE PREFERRED EMBODIMENT

Figure 1:
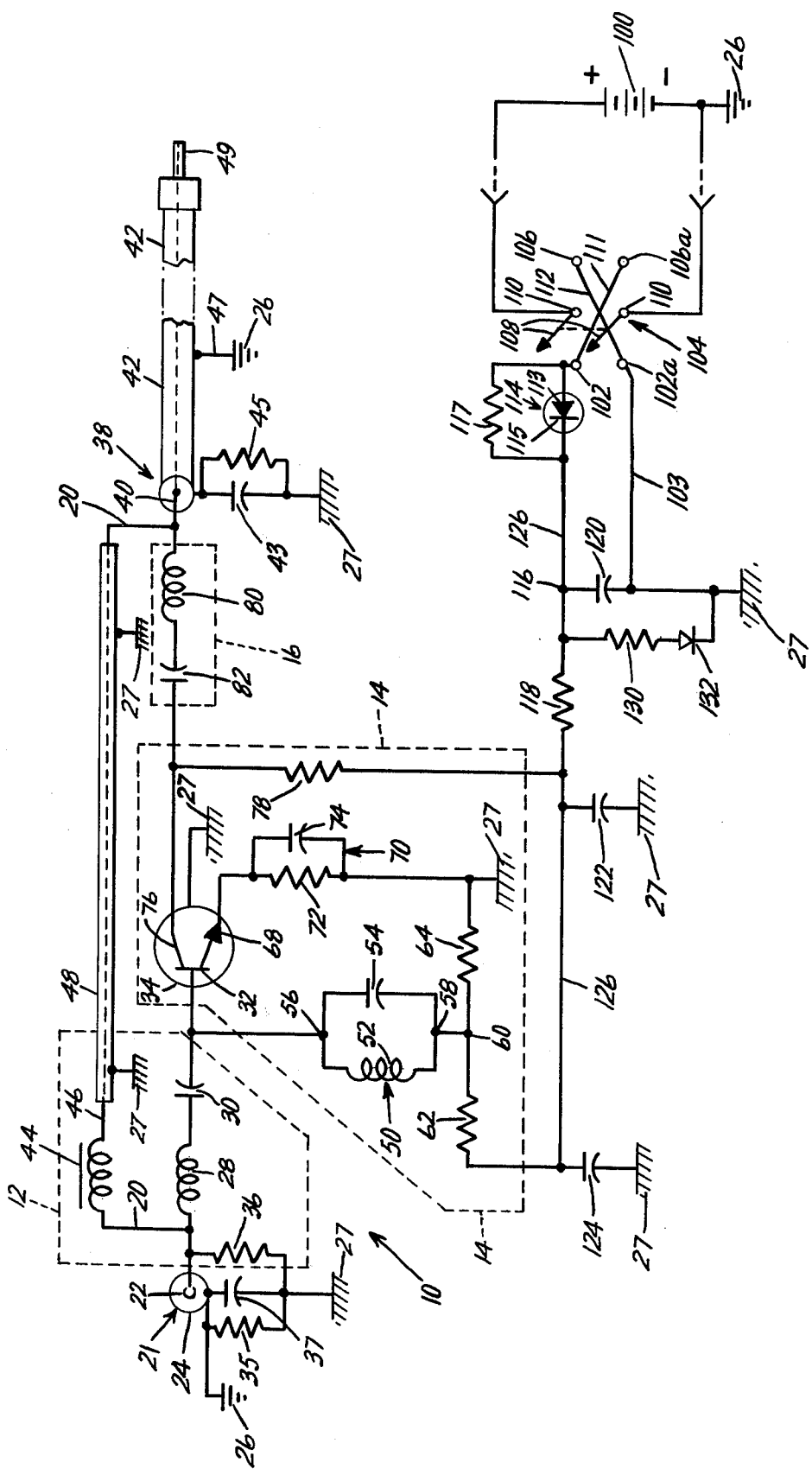
FIG. 1 is a schematic diagram of a preferred embodiment of this invention.

The embodiment shown in the drawing is an improvement over that in copending application Ser. No. 432,160, filed Jan. 10, 1974, and now U.S. Pat. No. 3,965,426 and where applicable, common reference numerals are used.

Referring now to FIG. 1 of the drawings, there is shown a schematic diagram of a pre-amplifier 10 for use with receivers adapted to receive both amplitude modulated (AM) and frequency modulated (FM) signals, respectively, it being well known that the AM signals are in a 560–1600 KHz band and FM signals are in a 88–108 MHz band. The pre-amplifier 10 includes a signal splitting circuit enclosed in dashed box 12, an FM signal amplifier in dashed box 14, and an AM signal blocking circuit and FM signal impedance matching circuit in dashed box 16.

Pre-amplifier 10 is provided with a conventional coaxial type input connector or receptacle 21 having terminals 22 and 24. The embodiment shown is adapted for use in an automotive vehicle having a vehicle ground 26. The pre-amplifier 10 is mounted in a radio chassis, not shown, that has a chassis ground 27. Terminal 24 is connected to ground 26 and terminal 22 is connected electrically in series with a first inductor 28 and capacitor 30 to the base 32 of an amplifier transistor 34. A bleed resistor 36 is connected between terminal 22 and ground 27. A parallel connected resistor 35 and filter capacitor 37 are connected between terminal 24 and chassis ground 27. Pre-amplifier 10 further includes a conventional coaxial type output connector or plug 38 having terminals 40, 42 and pin 49 which plugs directly into an antenna receptacle plug for an automotive radio receiver, not shown.

Input connector 22 is connected to output terminal 40 through a second inductor 44. Inductor 28 and capacitor 30 are selected to have a relatively large L/C ratio such that the two elements will pass signals having frequencies in the FM signal bands while the small capacitance of capacitor 30 effectively blocks signals having frequencies in the lower frequency AM signal bands. Similarly, inductor 44 has a larger inductance value such that it effectively blocks the passage of higher frequency FM signals while passing signals in the lower AM frequency bands.

To minimize noise such as, for example, noise generated by the ignition system of an automobile, conductor 46 connecting inductor 44 to terminal 40 is passed through a copper pipe 48 both ends of which are connected to ground 27.

A tuned circuit 50 includes a third inductor 52 and a capacitor 54 connected in parallel and has one terminal 56 thereof connected to base 32. The other terminal 58 of tuned circuit 50 is connected to tap 60 of a voltage divider including resistors 62 and 64. Inductor 52 and capacitor 54 are selected to have a relatively low L/C ratio such that the circuit has a relatively high impedance to signals in the FM radio frequency band and a relatively low impedance to signals in the AM ratio frequency band. Emitter 68 of transistor 34 is coupled to ground 27 through a parallel circuit 70 which includes a resistor 72 and capacitor 74. Collector 76 of amplifier transistor 34 is connected to one terminal of a load resistor 78.

Collector 76 is further connected to output connector terminal 40 via a series connected fourth inductor 80 and capacitor 82. Inductor 80 and capacitor 82 are selected to have a relatively low impedance to signals in the FM frequency bands and a relatively high impedance to signals in the AM radio frequency band such that AM signals on conductor 20 are effectively blocked thereby and will not be applied or fed back to the collector 76 of transistor 34. The parallel connected capacitance 43 and resistance 45 connect outer conductor 42 to chassis ground 27 and line 47 connects outer conductor 42 to vehicle ground 26.

Power for the pre-amplifier 10 is provided from a suitable source of direct current operating potential. Where the pre-amplifier 10 is used with an automotive type radio receiver, the source will be the automobile battery 100. The operating potential is applied through a separately mounted double-pole double-throw switch 104 having "on" terminals 102, 102a and "off" terminals 106, 106a. Switch arms 108 are pivotable in unison about pivot points 110 to contact on terminals 102, 102a or off terminals 106, 106a. Terminals 102, 102a and 106, 106a are connected by conductors 111, 112 so that polarity on terminals 102, 102a is reversed when arms 108 are switched from terminals 102, 102a to terminals 106, 106a.

The anode 113 of light emitting diode 114 is connected to terminal 102 and the cathode 115 of diode 114 is connected to junction 116. Diode 114 provides visual indication of the state of amplifier 34. Resistor 117 is connected across diode 114 to reduce impedance across diode 114 when switch 104 is in either the off or on position. Terminal 116 is coupled to load resistor 78 and voltage divider resistor 62 via a series connected resistor 118. A pair of filter capacitors 120 and 122 are connected from the opposite ends, respectively, of resistor 118 to ground 27. Capacitor 120 has a relatively large value and functions to bypass noise signals such as typically generated by the ignition system of an automobile. Capacitor 122 is of a relatively small value and functions as a shunt to bypass stray FM radio frequency signals to ground to prevent feedback thereof to the base 32 of transistor 34 via resistor 62 and circuit 50. Capacitor 124 also prevents feedback by being connected from DC supply line 126 to ground 27 at a point near resistor 62.

The filter circuit comprising capacitors 120, 122 and 124 between the pre-amplifier 10 and battery 100 effectively reduces most stray noise signals such as the ignition noise typically encountered in the automotive installations. Similarly, the AM signals passed to output terminal 40 via conductor 46 are effectively shielded from noise pickup by use of the copper tube shield.

Resistance 130 and diode 132 provide the necessary additional current to cause illumination of the diode 114 in the forward-bias condition of diode 114. Diode 132 prevents current flow through resistance 130 in the reverse-bias operation of diode 114, thereby maintaining an adequate reverse bias voltage on line 126.

In operation, AM and FM radio signals are received by an antenna, not shown, and applied across input terminals 22 and 24. The AM signals are effectively blocked by capacitor 30 and are passed with minimal attenuation to output connector 38, terminal 40, through inductor 44. Conversely, FM signals of higher frequency are passed with minimal attenuation through inductor 28 and capacitor 30 to the base 32 of the transistor 34, while these latter signals are effectively prevented from being applied directly to output connector 38 by inductor 44.

The FM signals passed through inductor 28 and capacitor 30 are applied across a tuned load in the form of tuned circuit 50 thereby providing a drive signal for amplifier transistor 34. The combination of inductors 28 and 52 and capacitances 30 and 54 and the junction capacitances form the band-pass input circuit. Also, capacitor 74 has an effect since it is common to both the input and output circuitry. The FM signals are amplified by the transistor 34 when switch 104 is in the on position. It should be observed that the parallel circuit including resistor 72 and capacitor 74 provides both stabilizing feedback for the amplifier circuit and functions to control the bandwidth of the amplifier 14.

The amplified FM signals are tuned and matched to the output line by the series resonant circuit consisting of inductor 80 and capacitor 82 and applied to output connector 38, terminal 40. Output connector 38 is connected directly to the antenna input terminal (not shown) of the conventional AM-FM signal receiver of an automobile.

The operation of the pre-amplifier 10 shown in FIG. 1 will be explained with the aid of the graphs of FIGS. 2 through 4. For amplifier operation, switch 104 is in the on position wherein switch arms 108 are connected to terminals 102 and 102a. This places a forward bias on diode 114 causing it to become illuminated by a current path through line 126, resistor 130 and diode 132 to chassis ground 27. Chassis ground 27 is placed at a relative negative potential to the positive terminal of battery 100, due to the connection between terminal 102a and chassis ground 27 through a conductor 103. In the on position of switch 104, emitter 68 of transistor 34 is at a relative negative potential since it is connected to chassis 27 through resistor 72. An FM signal at input terminal 22 is passed by inductor 28 and capacitor 30 and blocked by tuned circuit 50.

In the forward biased state, or amplifying state, transistor 34 has a base-collector capacitance which, when combined with the inductance of inductor 28 and capacitance of capacitor 30, along with the other circuit impedance, provides an L/C ratio for optimum passing of FM band frequencies. The ratio provides a gain-frequency curve as shown in FIG. 2 wherein gain is plotted along the ordinate and frequency along the absissca. The apex of the curve is intermediate and approximately centered in the FM band, 88 to 108 MHz, with the frequencies 88 MHz being plotted at 2a; 92 MHz at 2b; 96 MHz at 2c; 100 MHz at 2d; 104 MHz at 2e; and 108 MHz at 2f. Under certain strong input signal conditions, however, the total gain of pre-amplifier 10 and the receiver to which it is connected is excessive. For example, when the receiver is in a high signal area near an FM transmitter, it is desirable to switch out pre-amplifier transistor 34 to prevent overload distortion. If amplifier transistor 34 is simply disabled by opening the circuit of emitter 68 so that the received FM signal is applied across the base-collector junction of transistor 34, two undesirable results occur. First, the signal is substantially attenuated due to the high impedance across the base-collector junction and second, the circuit capacitance change caused by opening the emitter circuit changes the circuit L/C ratio due to internal capacitance changes in the transistor in the unenergized state thereby moving the apex of the gain-frequency curve to that position shown in the curve of FIG. 3. The frequency 88 MHz is plotted at 3a; 92 MHz at 3b; 96 MHz at 3c; 100 MHz at 3d; 104 MHz at 3e; and 108 MHz at 3f. It is seen that the signals at 88 MHz and 92 MHz are well down on the gain curve so that they would be sharply attenuated. Further, the active state of amplifier transistor 34 (FIG. 2 curve) was measured with a 28 db attenuating pad in the measuring circuit while the unenergized state of transistor 34 (FIG. 3 curve) was measured with only a 9 db pad in the circuit. This difference in gain characteristic and the shift of the curve proved unsatisfactory.

Figure 5:
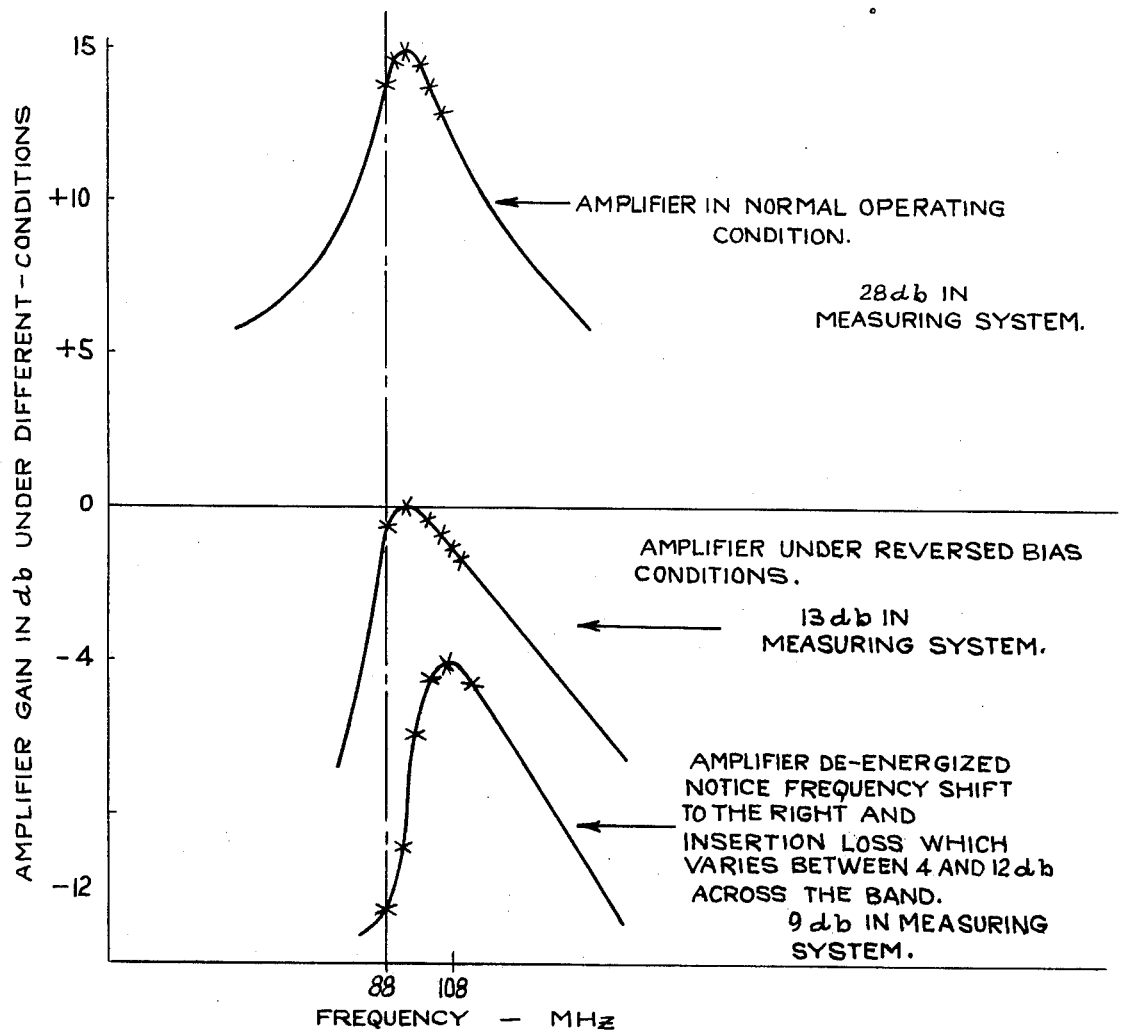
FIG. 5 is a graph of three curves on a gain plot further used in explaining the invention.

FIG. 5 is a further illustration of the operating characteristics of this invention wherein all three curves of FIGS. 2, 3 and 4 are presented in their relative positions on a common gain plot. The notations in the FIGURE are self-explanatory with the positions of the three curves in their offset relation graphically shown. In measuring to obtain the three gain curves in FIG. 5, a 28 db pad in the external attenuator was used in obtaining the top curve; a 13 db pad was used to obtain the center curve; and 9 db pad was used of obtain the bottom curve. These several values of attenuation were used to keep the gain curves on the oscilloscope.

This invention teaches application of reverse bias to transistor 34 in place of opening the emitter 68 circuit or bypassing the transistor 34. Significantly improved results are obtained since (1) the apex of the gain-frequency curve remains substantially centered in the frequency band of 88 to 108 MHz as it is in the FIG. 2 curve, and (2) the base-collector impedance of transistor 34 is reduced thereby reducing the attenuation of the received signals. The reverse bias to transistor 34 is applied by switching switch 104 to the off position wherein arms 108 are thrown in contact with contacts 106 and 106a. In this position, a negative potential is applied to anode 113 of diode 114 and a positive potential is applied to terminal 106, line 112, terminal 102a and chassis 27. This raises the potential at emitter 68 due to its connection to chassis 27 through resistor 72, reverse biasing transistor 34. In the reverse biased condition, the capacitance across the base-collector junction of transistor 34 is increased by an amount which compensates for the change in capacitance across the base-emitter junction of transistor 34 in the forward bias state, thus maintaining the overall L/C ratio to the transmitted signal substantially the same thereby keeping the apex of the gain-frequency curve at approximately the same point which may be seen by comparing the curves of FIGS. 2 and 4. In FIG. 4, frequency 88 MHz is plotted at point 4a; 92 MHz at 4b; 96 MHz at 4c; 100 MHz at 4d; 104 MHz at point 4e; and 108 MHz at point 4f. The relative gain spread across the FM band is substantially the same as it is for the curve of FIG. 2 and the curve was obtained with a 13 db attenuated pad in the measuring circuit, a 4 db improvement over the FIG. 3 curve. The gain spread across the band defined by points 2a–2f is 1.75 db and the gain spread across the band defined by points 4a–4f is 1.0 db. The half power, or 3 db down points, on the curve of FIG. 2 are at 84.8 MHz and 111.2 MHz and for the curve of FIG. 4 are at 83.8 and 118 MHz.

In the reverse-biased operation of the circuit, the base-collector voltage drop is 0.68 volts and the base-emitter voltage drop is 0.42 volts. Forward biased, total operating current is 25 milliamps DC of which 18 milliamps is used to operate the L.E.D. and reverse biased current is 0.47 milliamps DC.

Since the switch 104 carries only D.C. current, it does not require radio frequency (RF) cabling and therefore may be placed at any convenient location. Also, the chassis box, and printed circuit boards may be optionally located and designed due to the wide adaptability of switch 104 location.

In a working embodiment of the invention, the following circuit values were used:

| | | |
|---|---|---|
| Transistor | 34 | BFX-89 or 2 N 5179 |
| Inductors | 28 | 8½ turns, ¼" I.D. (36TP1) |
| | 44 | 4.7 Micro-henrys (R.F. choke) |
| | 52 | 2½ turns, ¼" I.D. (36TP1) |
| | 80 | 5½ turns, ¼" I.D. (36TP1) |
| Capacitors | 30, 82 | 10 pfd. |
| | 37 | .001 mfd. |
| | 43 | .001 mfd. |
| | 54 | 150 pfd. ± 10% |
| | 74 | 300 pfd. |
| | 120 | .47 or .68 mfd. 250 VDC |
| | 122 | .005 mfd. ± 20% 100 V. |
| | 124 | .001 mfd. GMV |
| Resistors | 36 | 100 K ohms |
| | 62 | 4.7 K ohms |
| | 64 | 2.2 K ohms |
| | 72 | 330 ohms |
| | 78 | 560 ohms ¼ W. |
| | 117 | 27 K ¼ or ½ W. |
| | 118 | 2.2 K ohms ± 10% ¼ W. |
| | 130 | 470 ohms ¼ W. |
| Diode | 114 | CM 4-23 |
| | 132 | IN 4148 |

While there have been described above the principles of this invention in connection with specific apparatus, it is to be clearly understood that this description is made only by way of example and not as a limitation to the scope of the invention.

What is claimed is:

1. Apparatus comprising:
    first circuit means for passing a band of frequencies and attenuating all other freqencies;
    amplifying means coupled to said first circuit means having an amplifying state for amplifying said band of frequencies and a non-amplifying state;
    said first circuit means and said amplifying means having a first gain spread for the frequencies in said band of frequencies, when said amplifying means is in said amplifying state and a second gain spread for the frequencies in said band of frequencies when said amplifying means is in said non-amplifying state;

switch means coupled to said amplifying means for switching said amplifying means between said amplifying state and said non-amplifying state; and second circuit means coupled to said switch means for making said first gain spread and said second gain spread substantially equal.

2. The apparatus according to claim 1 wherein said second circuit means comprises a biasing source for forward biasing said amplifying means in said amplifying state and reverse biasing said amplifying means when said amplifying means is switched to said non-amplifying state.

3. The apparatus according to claim 2 wherein said biasing source comprises a battery connected to said amplifying means to provide DC potential of a first polarity to said amplifying means; and said switch means including a manually operated switch coupled between said battery and said amplifying means for reversing the connection between said battery and said amplifying means to reverse said first polarity to said amplifying means upon switching between said amplifying state and said non-amplifying state.

4. The apparatus according to claim 2 wherein said biasing source comprises a DC potential source having a positive and a negative terminal; a light emitting diode having an anode and a cathode; a resistive path being between said cathode and said negative terminal when said switch means has switched said amplifying means to said amplifying state; a diode being in said resistive path to provide current flow in said resistive path when said amplifying means is in said amplifying state and to block current flow when said amplifying means is in said non-amplifying state.

5. The apparatus according to claim 4 including a component mounting chassis wherein said resistive path comprises a resistor and said diode having an anode and a cathode, said resistor being connected between the cathode of the light emitting diode and the anode of said diode; the cathode of said diode being connected to said chassis; a capacitor being shunted across said resistive path; said switch means comprises a double-pole double-throw switch, a first throw of said switch connecting a plus polarity of said potential source to the anode of said light emitting diode and connecting the minus potential to said chassis; a second throw of said switch connecting the minus polarity of said battery to the anode of said light emitting diode and the plus potential to said chassis.

6. The apparatus according to claim 4 with said amplifying means comprising a transistor having a base, emitter and collector, a base-emitter junction and a base-collector junction;

said second circuit means biasing said base-emitter junction in a forward biasing direction when said switch means has switched said amplifying means into said amplifying state and biasing said base-emitter junction in a reverse bias direction when said siwtch means has switched said amplifying means to said non-amplifying state;

a component mounting chassis wherein said resistive path comprises a resistor and said diode having an anode and a cathode, said resistor being connected between the cathode of the light emitting diode and the anode of said diode; the cathode of said diode being connected to said chassis; a capacitor being shunted across said resistive path; said switch means comprises a double-pole double-throw switch, a first throw of said switch connecting a plus polarity of said potential source to the anode of said light emitting diode and connecting the minus potential to said chassis, a second throw of said switch connecting the minus polarity of potential source to the anode of said light emitting diode and the plus potential to said chassis; and said cathode of said light emitting diode is resistively coupled to said collector, and said emitter being coupled to said chassis.

7. The apparatus according to claim 1 including visual signal means for visually indicating when said amplifying means is in said amplifying state.

8. The apparatus according to claim 1 including filter means coupled to said amplifying means and said second circuit means for filtering noise from said amplifying means.

9. The apparatus according to claim 1 with said amplifying means comprising a transistor having a base, emitter and collector, a base-emitter junction and a base-collector junction; and said second circuit means biasing said base-emitter junction in a forward biasing direction when said switch means has switched said amplifying means into said amplifying state and biasing said base-emitter junction in a reverse bias direction when said switch means has switched said amplifying means to said non-amplifying state.

10. The apparatus according to claim 9 including a component mounting chassis, said second circuit means comprising a direct current potential source, said switch means comprises a double-pole double-throw switch, a first throw of said switch connecting a plus polarity of said potential source to said collector and connecting the minus polarity of said potential source to the anode of said chassis; a second throw of said switch connecting the minus polarity of said potential source to said collector and the plus polarity to said chassis.

* * * * *

UNITED STATES PATENT OFFICE
CERTIFICATE OF CORRECTION

Patent No. 4,028,629        Dated  June 7, 1977

Inventor(s)   Robert S. Ringland

It is certified that error appears in the above-identified patent and that said Letters Patent are hereby corrected as shown below:

Column 3, line 22             "ratio" should be --radio--

Claim 1, Column 6, line 62    "freqencies" should be
                              --frequencies--

Claim 5, Column 7, line 54    "battery" should be
                              --potential source--.

Signed and Sealed this thirtieth Day of August 1977

[SEAL]

Attest:

RUTH C. MASON
Attesting Officer

C. MARSHALL DANN
Commissioner of Patents and Trademarks